US011303302B2

(12) United States Patent
Wu et al.

(10) Patent No.: US 11,303,302 B2
(45) Date of Patent: Apr. 12, 2022

(54) ERASURE CODE CALCULATION METHOD

(71) Applicant: BEIJING iChinaE SCIENCE & TECHNOLOGY CO., LTD., Beijing (CN)

(72) Inventors: Siqi Wu, Beijing (CN); Xiaoling Wu, Beijing (CN)

(73) Assignee: BEIJING iChinaE SCIENCE & TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 17/199,093

(22) Filed: Mar. 11, 2021

(65) Prior Publication Data

US 2021/0273654 A1   Sep. 2, 2021

Related U.S. Application Data

(63) Continuation of application No. PCT/CN2020/129231, filed on Nov. 17, 2020.

(30) Foreign Application Priority Data

Nov. 18, 2019 (CN) .......................... 201911128043.7

(51) Int. Cl.
*H03M 13/15* (2006.01)
*H03M 13/11* (2006.01)
(Continued)

(52) U.S. Cl.
CPC ....... *H03M 13/154* (2013.01); *H03M 13/118* (2013.01); *H03M 13/1168* (2013.01);
(Continued)

(58) Field of Classification Search
None
See application file for complete search history.

(56) References Cited

U.S. PATENT DOCUMENTS 5,369,652 A * 11/1994 Bailey ................ G06F 11/1008
360/47
6,079,042 A * 6/2000 Vaman ................... H03M 13/11
714/755
(Continued)

FOREIGN PATENT DOCUMENTS

CN    104850468 A    8/2015
CN    105335150 A    2/2016
(Continued)

OTHER PUBLICATIONS

Wang Yi-Jie, Xu Fang-Liang, Pei Xiao-Qiang; Research on Erasure Code-Based Fault-Tolerant Technology for Distributed Storage; Jan. 31, 2017; National Laboratory for Parallel and Distributed Processing, National University of Defense Technology, Changsha.
(Continued)

*Primary Examiner* — Steve N Nguyen (57) ABSTRACT

The present invention discloses an erasure code calculation method, including the following steps: S1) splitting original data, and building an original encoding matrix M; S2) acquiring a transverse exclusive OR encoding matrix M1; S3) acquiring a longitudinal exclusive OR encoding matrix M2; S4) acquiring an exclusive OR encoding matrix M3 according to the transverse exclusive OR encoding matrix M1 and the longitudinal exclusive OR encoding matrix M2; S5) transforming a data position of the transverse exclusive OR encoding matrix M1 to acquire a storage matrix M4; S6) judging whether storage nodes at which the last column of data of the storage matrix M4 is stored are damaged; S7) restoring the lost data according to a position 1 of the damaged node; and S8) restoring the lost data according to a position 2 of the damaged node. In the present invention, the operation is rapid, and calculation efficiency is high.

4 Claims, 3 Drawing Sheets

(51) Int. Cl.
*H03M 13/29* (2006.01)
*H03M 13/27* (2006.01)
*H03M 13/19* (2006.01)

(52) U.S. Cl.
CPC .......... *H03M 13/19* (2013.01); *H03M 13/27* (2013.01); *H03M 13/2903* (2013.01)

(56) References Cited

U.S. PATENT DOCUMENTS

| | | | | |
|---|---|---|---|---|
| 6,367,047 | B1* | 4/2002 | McAuliffe | G11B 20/1833 |
| | | | | 714/755 |
| 7,093,182 | B2 | 8/2006 | Dickson | |
| 7,467,281 | B2* | 12/2008 | Edirisooriya | G06F 11/1076 |
| | | | | 711/114 |
| 8,595,606 | B1* | 11/2013 | Feng | H03M 13/2909 |
| | | | | 714/800 |
| 9,594,634 | B2 | 3/2017 | Gopal et al. | |
| 10,063,261 | B1* | 8/2018 | Croxall, II | H03M 13/2921 |
| 10,445,164 | B2 | 10/2019 | Resch | |
| 10,771,191 | B2* | 9/2020 | Fang | H04L 1/005 |
| 2002/0162072 | A1* | 10/2002 | Thesling, III | H03M 13/2963 |
| | | | | 714/777 |
| 2005/0138525 | A1* | 6/2005 | Helbig | H03M 13/2918 |
| | | | | 714/766 |
| 2008/0016435 | A1* | 1/2008 | Goel | G06F 11/1076 |
| | | | | 714/801 |
| 2009/0193314 | A1* | 7/2009 | Melliar-Smith | H04L 1/0041 |
| | | | | 714/755 |
| 2018/0054217 | A1 | 2/2018 | Schwaderer | |
| 2019/0317858 | A1 | 10/2019 | Danilov et al. | |

FOREIGN PATENT DOCUMENTS

| | | |
|---|---|---|
| CN | 108132854 A | 6/2018 |
| CN | 110277131 A | 9/2019 |
| CN | 111078460 A | 4/2020 |

OTHER PUBLICATIONS

Jalaluddin Qureshi1, Adeel Malik; On Optimization of Wireless XOR Erasure Codes; Dec. 31, 2018; Department of Computer Science, National University of Computer & Emerging Sciences, Karachi, Pakistan; Communications & Networking (CNN) Laboratory, Dankook University, Yongin-si, South Korea.

Wu Siqi; Calculation of Fast Erasure Code Based on Exclusive or Operation; Mar. 31, 2020; School of Electronic Information and Electrical Engineering, Shanghai Jiaotong University, Shanghai 200240, China.

* cited by examiner

ERASURE CODE CALCULATION METHOD

CROSS-REFERENCE TO RELATED APPLICATIONS

This application is a continuation of International Application No. PCT/CN2020/129231, filed on Nov. 17, 2020, which claims the benefit of priority from Chinese Patent Application No. 201911128043.7, filed on Nov. 18, 2019. The content of the aforementioned applications, including any intervening amendments thereto, is incorporated herein by reference.

TECHNICAL FIELD

The present invention relates to the technical field of data protection, and particularly relates to an erasure code calculation method.

BACKGROUND OF THE PRESENT INVENTION

With respect to the defects of a traditional data redundancy protection technology in a large-capacity disk storage system, a more efficient data redundancy technology, i.e., erasure code, occurs in a mass storage system with characteristics of large-scale and large-capacity distributed disk storage. The erasure codes originate from the field of communication transmission and gradually occur in the large-scale storage system at present, particularly a distributed storage environment. A basic idea of the erasure code technology is to divide one part of data into k blocks of original data and then calculate m blocks of redundant data based on the k blocks of original data. For the (k+m) blocks of data, the original k blocks of data can be restored in the storage system by a reconstruction algorithm when any m blocks of elements are wrong. The erasure code redundancy protection technology solves the problem that the traditional redundancy protection technology is unsuitable for a distributed production storage system.

The erasure codes may be applied to any application programs or systems with mass data and fault tolerance needs, such as disk array systems, data grids, distributed storage application programs, object storage or archival storage. Compared with the traditional mirror image and copy technologies, the method based on erasure codes has the advantages of low redundancy and high disk utilization rate. At present, a common use case of the erasure codes is object-based cloud storage. With respect to diversified large-scale storage capacity needs of cloud computing and big data services on the mass storage system, the erasure codes can well adapt to the distributed storage application environments such as the cloud computing and big data services.

The erasure code is an effective data fault tolerance method and is generally represented as n=k+m. The variable k represents the quantity of original data; the variable m represents the quantity of verification data that is added after fault and provides protection; and the variable n represents the total quantity of data created after encoding of the erasure code. The erasure code is low in data redundancy cost, realizes high data reliability and is widely applied to the distributed storage system.

However, a general erasure code algorithm needs to be operated by matrix multiplication, and is relatively complex, heavy in operation and difficult in calculation hardware converting. When m is equal to 1, verification data at m=1 can be calculated by exclusive OR operations of k blocks of original data. For example, k blocks of original data such as $D_1, D_2, D_3, \ldots, D_{k-1}, D_k$ are subjected to exclusive OR operations one by one to obtain verification data C, wherein $C=D_1 \text{xor} D_2 \text{xor} D_3 \ldots D_{k-1} \text{xor} D_k$; and xor represents an exclusive OR symbol. Then, the original data and the verification data are respectively stored. Any lost or damaged data can be restored by exclusive OR operations of other data. The exclusive OR operation is simple and efficient and is easily realized by hardware, and thus is an efficient erasure code implementation manner. However, a condition that m is more than 1 cannot be directly realized in such a manner, and only one verification data can be produced. The present invention provides a method which can realize a data verification effect of m=2 by the exclusive OR operations.

SUMMARY OF THE PRESENT INVENTION

A purpose of the present invention is to provide an erasure code calculation method, for solving a problem that two verification data cannot be generated by an exclusive OR operation in an existing erasure code implementation manner. In the present invention, when two storage nodes are both damaged, the two verification data can be generated by the exclusive OR operation only; all lost data are restored; operation is rapid; and calculation efficiency is high.

To achieve the above purpose, the present invention adopts the following technical solutions:

The erasure code calculation method includes the following steps:

S1) acquiring original data to be stored; splitting the original data; and building an original encoding matrix M;

S2) executing a transverse exclusive OR operation on the original encoding matrix M to acquire a transverse exclusive OR encoding matrix M1;

S3) executing a longitudinal exclusive OR operation on the original encoding matrix M to acquire a longitudinal exclusive OR encoding matrix M2;

S4) acquiring an exclusive OR encoding matrix M3 according to the transverse exclusive OR encoding matrix M1 and the longitudinal exclusive OR encoding matrix M2;

S5) transforming a data position of the transverse exclusive OR encoding matrix M1 to acquire a storage matrix M4; and storing each column of data in the storage matrix M4 into storage nodes;

S6) judging whether storage nodes at which the last column of data of the storage matrix M4 is stored are damaged; if so, entering a step S7); otherwise, entering a step S8);

S7) acquiring a position 1 of the lost node; and restoring the lost data according to the position 1 of the lost node; and S8) acquiring a position 2 of the lost node; and restoring the lost data according to the position 2 of the lost node.

The steps in the present invention sequentially as follows: splitting the original data; executing the transverse exclusive OR operation on check codes; executing longitudinal exclusive OR operation on the check codes; rearranging the original data; combining the rearranged data with the check code data; grouping the combined data in columns; and storing the data into corresponding storage nodes according to groups. When the two storage nodes are damaged, it is judged whether the storage nodes at which the last column of data of the storage matrix M4 is stored are damaged; data in undamaged nodes are read out; and different reverse operations are conducted with respect to different damage positions of the storage nodes, thereby restoring the lost data. In the present invention, the lost data can be restored by the exclusive OR operations only when the two storage nodes are damaged; and the operation efficiency is high.

Further, the step S1) of splitting the original data and building the original encoding matrix M includes steps:

S11) splitting the original data into n data blocks, wherein each data block includes $k^2$ data;

S12) setting splitting periods; and splitting the $k^2$ data in each data block according to the splitting period, wherein each splitting period includes k data; and S13) sequentially arranging the data in each splitting period in rows; and forming an original encoding matrix $$M = \begin{bmatrix} D_{11} & D_{12} & \cdots & D_{1k-1} & D_{1k} \\ D_{21} & D_{22} & \cdots & D_{2k-1} & D_{2k} \\ \vdots & \vdots & \ddots & \vdots & \vdots \\ D_{x1} & D_{x2} & \cdots & D_{xk-1} & D_{xk} \\ \vdots & \vdots & \ddots & \vdots & \vdots \\ D_{k1} & D_{k2} & \cdots & D_{kk-1} & D_{kk} \end{bmatrix}$$

of k rows and k columns, wherein $D_{xk-1}$ represents the (k−1)th data of the xth splitting period.

The original data is split into n data blocks; the quantity of each data block is k*k data; and the data are arranged according to a k*k matrix so as to form the original encoding matrix M.

Further, the step S2) of executing the transverse exclusive OR operation on the original encoding matrix M to acquire the transverse exclusive OR encoding matrix M1 includes steps:

S21) executing the exclusive OR operation on each row of data in the original encoding matrix M to acquire a transverse verification value set Cr={$Cr_1$, $Cr_2$, ..., $Cr_x$, ..., $Cr_{k-1}$, $Cr_k$} wherein $Cr_x$ represents the xth row of transverse verification values of the original encoding matrix M; $Cr_x = D_{x1} xor D_{x2} xor D_{x3} \ldots D_{xk-1} xor D_{xk}$; and xor is an exclusive OR symbol;

S22) adding each transverse verification value in the transverse verification value set Cr into columns of the original encoding matrix M to acquire a transverse exclusive OR encoding matrix $$M1 = \begin{bmatrix} D_{11} & D_{12} & \cdots & D_{1k-1} & D_{1k} & Cr_1 \\ D_{21} & D_{22} & \cdots & D_{2k-1} & D_{2k} & Cr_2 \\ \vdots & \vdots & \ddots & \vdots & \vdots & \vdots \\ D_{x1} & D_{x2} & \cdots & D_{xk-1} & D_{xk} & Cr_x \\ \vdots & \vdots & \ddots & \vdots & \vdots & \vdots \\ D_{k1} & D_{k2} & \cdots & D_{kk-1} & D_{kk} & Cr_k \end{bmatrix}$$

of k rows and k+1 columns.

The transverse verification values of each row of data are acquired by the transverse exclusive OR operations and then added into the original encoding matrix M; and one column is increased, so that the original encoding matrix M is transformed into a matrix of k rows and k+1 columns, that is, the transverse exclusive OR encoding matrix M1 of k rows and k+1 columns.

Further, the step S3) of executing the longitudinal exclusive OR operation on the original encoding matrix M to acquire the longitudinal exclusive OR encoding matrix M2 includes steps:

S31) executing exclusive OR operations on each column of data in the original encoding matrix M to acquire a longitudinal verification value set Cc={$Cc_1$, $Cc_2$, ..., $Cc_x$, ..., $Cc_{k-1}$, $Cc_k$}, wherein $Cc_x$ represents the xth column of longitudinal verification values of the original encoding matrix M; $Cc_x = D_{1x} xor D_{2x} xor D_{3x} \ldots D_{k-1,x} xor D_{kx}$;

S32) adding each longitudinal verification value in the longitudinal verification value set Cc into rows of the original encoding matrix M to acquire a longitudinal exclusive OR encoding matrix $$M2 = \begin{bmatrix} D_{11} & D_{12} & \cdots & D_{1k-1} & D_{1k} \\ D_{21} & D_{22} & \cdots & D_{2k-1} & D_{2k} \\ \vdots & \vdots & \ddots & \vdots & \vdots \\ D_{x1} & D_{x2} & \cdots & D_{xk-1} & D_{xk} \\ \vdots & \vdots & \ddots & \vdots & \vdots \\ D_{k1} & D_{k2} & \cdots & D_{kk-1} & D_{kk} \\ Cc_1 & Cc_2 & \cdots & Cc_{k-1} & Cc_k \end{bmatrix}$$

of k+1 rows and k columns.

The longitudinal verification values of each column of data are acquired by the longitudinal exclusive OR operations and then added into the original encoding matrix M; and one row is increased, so that the original encoding matrix M is transformed into a matrix of k+1 rows and k columns, that is, the longitudinal exclusive OR encoding matrix M2 of k+1 rows and k columns.

Further, the step S4) of acquiring the exclusive OR encoding matrix M3 according to the transverse exclusive OR encoding matrix M1 and the longitudinal exclusive OR encoding matrix M2 includes steps:

S41) executing exclusive OR operations on all the longitudinal verification values in the longitudinal verification value set Cc to obtain a total verification value $C = Cc_1 xor Cc_2 xor Cc_3 \ldots CC_{k-1} xor Cc_k$; or executing exclusive OR operations on all the transverse verification values in the transverse verification value set Cr to obtain a total verification value $C = Cr_1 xor Cr_2 xor Cr_3 \ldots Cr_{k-1} xor Cr_k$; and S42) acquiring an exclusive OR encoding matrix $$M3 = \begin{bmatrix} D_{11} & D_{12} & \cdots & D_{1k-1} & D_{1k} & Cr_1 \\ D_{21} & D_{22} & \cdots & D_{2k-1} & D_{2k} & Cr_2 \\ \vdots & \vdots & \ddots & \vdots & \vdots & \vdots \\ D_{x1} & D_{x2} & \cdots & D_{xk-1} & D_{xk} & Cr_x \\ \vdots & \vdots & \ddots & \vdots & \vdots & \vdots \\ D_{k1} & D_{k2} & \cdots & D_{kk-1} & D_{kk} & Cr_k \\ Cc_1 & Cc_2 & \cdots & Cc_{k-1} & Cc_k & C \end{bmatrix}$$

of k+1 rows and k+1 columns.

All the longitudinal verification values in the longitudinal verification value set Cc are subjected to exclusive OR operations; the obtained result is the total verification value C; then the exclusive OR encoding matrix M3 of k+1 rows and k+1 columns is built; and the total verification value C is also equal to exclusive OR operation results of all the transverse verification values in the transverse verification value set Cr.

Further, the step S5) of transforming the data position of the transverse exclusive OR encoding matrix M1 to acquire the storage matrix M4 includes steps:

S51) setting bits of ring shift left for each row of data in the transverse exclusive OR encoding matrix M1; wherein the bit of ring shift left of the xth row is (x−1)*z and z is bit width of single data; and acquiring the bits of ring shift left for each row of data in the transverse exclusive OR encoding matrix M1;

S52) performing ring shift left according to the bits of ring shift left for each row of data in the transverse exclusive OR encoding matrix M1 to acquire a dislocation arrangement matrix $$M5 = \begin{bmatrix} D_{11} & D_{12} & \cdots & D_{1k-1} & D_{1k} & Cr_1 \\ D_{22} & D_{23} & \cdots & D_{2k} & Cr_2 & D_{21} \\ \vdots & \vdots & \ddots & \vdots & \vdots & \vdots \\ D_{xx} & D_{xx+1} & \cdots & D_{xk-3} & D_{xk-2} & D_{xx-1} \\ \vdots & \vdots & \ddots & \vdots & \vdots & \vdots \\ D_{kk} & Cr_k & \cdots & D_{kk-3} & D_{kk-2} & D_{kk-1} \end{bmatrix}$$

of k rows and k+1 columns; and

S53) adding each element in the longitudinal verification value set Cc into columns of the dislocation arrangement matrix M5 to acquire a storage matrix $$M4 = \begin{bmatrix} D_{11} & D_{12} & \cdots & D_{1k-1} & D_{1k} & Cr_1 & Cc_1 \\ D_{22} & D_{23} & \cdots & D_{2k} & Cr_2 & D_{21} & Cc_2 \\ \vdots & \vdots & \ddots & \vdots & \vdots & \vdots & \vdots \\ D_{xx} & D_{xx+1} & \cdots & D_{xk-3} & D_{xk-2} & D_{xx-1} & Cc_x \\ \vdots & \vdots & \ddots & \vdots & \vdots & \vdots & \vdots \\ D_{kk} & Cr_k & \cdots & D_{kk-3} & D_{kk-2} & D_{kk-1} & Cc_k \end{bmatrix}$$

k rows and k+2 columns.

The data position of the transverse exclusive OR encoding matrix M1 is transformed so as to form dislocation arrangement; a coordinate of any one data in the transverse exclusive OR encoding matrix M1 is set as (x',y'); x' is a horizontal coordinate of the data in the transverse exclusive OR encoding matrix M1; and y' is a vertical coordinate of the data in the transverse exclusive OR encoding matrix M1.

Thus, a position of the data after dislocation arrangement is $(x^0, y^0)$; $x^0=x'$; $y^0=((y'-(x'-1))<=0)*(k+1)+(y'-(x'-1))$; $<=$ represents comparison between $y'-(x'-1)$ and 0; if $y'-(x'-1) \neq 0$, the value of $((y'-(x'-1))<=0)$ is 0; and if $y'-(x'-1)=0$, the value of $((y'-(x'-1))<=0)$ is 1. The dislocation arrangement process is equivalent to performing ring shift left on the data of the whole transverse exclusive OR encoding matrix M1 in rows by bit width of (row number−1)*single data; a bit number of the ring shift left in the $1^{st}$ row is 0; a bit number of the ring shift left in the $2^{nd}$ row is (2−1)*z; and a bit number of the ring shift left in the xth row is (x−1)*z. Each longitudinal verification value in the longitudinal verification value set Cc is added into the last column of the dislocation arrangement matrix M5 after dislocation arrangement, so as to acquire the storage matrix M4.

Further, the step S5) of storing each column of data in the storage matrix M4 into storage nodes includes steps:

S54) grouping the storage matrix M4 in columns, wherein each column is a group; totally k+2 data groups are formed and recorded as $\{G_1, G_2, \ldots, G_{k+1}, G_{k+2}\}$. $G_{k+1}$ represents the (k+1)th data group; and $$G_{k+1} = \begin{bmatrix} Cr_1 \\ D_{21} \\ \vdots \\ D_{xx-1} \\ \vdots \\ D_{kk-1} \end{bmatrix};$$

S55) acquiring k+2 storage nodes; and recording the k+2 storage nodes as $\{Node_1, Node_2, \ldots Node_{k+1}, Node_{k+2}\}$, wherein $Node_{k+1}$ represents the (k+1)th storage node; and S56) respectively storing the k+2 data groups into storage nodes that correspond to subscripts of the data groups; and storing the (k+1)th data group into the (k+1)th storage node.

In the present invention, the data in the storage matrix M4 are grouped in columns; each column is a group; totally k+2 data groups are formed and are respectively $G_1, G_2, G_3 \ldots G_{k+1}$ and $G_{k+2}$, e.g., data in the $G_1$ are $D_{11}, D_{22}, \ldots, D_{XX}, \ldots, D_{kk}$; data in the $G_2$ are $D_{12}, D_{23}, \ldots, D_{XX+1}, \ldots, Cr_k$; and by parity of reasoning, finally data in the $G_{k+2}$ are $Cc_1, Cc_2, \ldots, Cc_x, \ldots, Cc_k$. Each group of data is processed in a unified manner and stored in a distributed manner; totally k+2 storage nodes are needed, that is, $Node_1$, $Node_2$, $Node_3 \ldots Node_{k+1}$ and $Node_{k+2}$ respectively. Each group of data is stored onto storage nodes corresponding to the subscripts so as to complete data encoding and storage.

Further, in the step S7), the position 1 of the lost node is acquired; and the position 1 of the lost node is any one storage node in the first k+1 storage nodes and the (k+2)th storage node.

The step of restoring the lost data according to the position 1 of the lost node includes steps:

S71) acquiring data in all undamaged storage nodes; arranging unlost data according to an arrangement manner of the exclusive OR encoding matrix M3; acquiring a decoding matrix M6; and acquiring positions of each row of lost data in the decoding matrix M6;

S72) executing transverse exclusive OR operations on unlost data on the ith row of the decoding matrix M6 one by one in rows; acquiring respective transverse exclusive OR operation values $C_i$ of the unlost data on the ith row in rows; filling the values $C_i$ into the positions of the lost data on the ith row, wherein $i \in \{1, 2, \ldots, k\}$; sequentially restoring all the lost data on the first k rows of the decoding matrix M6; and acquiring a first-k-row restoration matrix M7;

S73) executing longitudinal exclusive OR operations on the jth column of the first-k-row restoration matrix M7; filling longitudinal exclusive OR operation values of the jth column into the (k+1)th row and the jth column of the decoding matrix M6, wherein $j \in \{1, 2, \ldots, k, k+1\}$; and restoring all the lost data on the (k+1)th row of the decoding matrix M6.

When two storage nodes are damaged, it is judged whether the storage node at which the last column of data in the storage matrix M4 is stored is damaged, i.e., whether the (k+2)th storage node is damaged; if damaged, data in all undamaged storage nodes are acquired; a corresponding value of each element in the storage matrix M4 can be found at a corresponding coordinate of the exclusive OR encoding matrix M3; the unlost data are arranged in an arrangement manner of the exclusive OR encoding matrix M3; and the decoding matrix M6 is acquired, that is, the exclusive OR encoding matrix M3. When the (k+2)th storage node is damaged, data on the last row of the decoding matrix M6 are totally damaged; and one data is damaged on each row in the first k rows of the decoding matrix M6. Thus, transverse exclusive OR operations are executed on each row in the first k rows of the decoding matrix M6; then, the transverse exclusive OR operation values on each row are filled into positions of the lost data on the row; and all the lost data on the first k rows of the decoding matrix M6 are restored in sequence. The first-k-row restoration matrix M7 is composed of data on the first k rows of the decoding matrix M6; the longitudinal exclusive OR operations are executed on the first-k-row restoration matrix M7; and all the lost data on the (k+1) row of the decoding matrix M6 are restored.

Further, in the step S8), the positions 2 of the lost node are acquired; and the positions 2 of the lost node are any two storage nodes in the first k+1 storage nodes.

The step of restoring the lost data according to the position 2 of the lost node includes steps:

S81) acquiring data in all undamaged storage nodes; arranging unlost data according to an arrangement manner of the exclusive OR encoding matrix M3; acquiring a decoding matrix M8; and acquiring positions of lost data in the decoding matrix M8;

S82) executing transverse exclusive OR operations on the first k data on the (k+1)th row of the decoding matrix M8; acquiring a total verification value C; and filling the total verification value C into the (k+1)th row and the (k+1)th column of the decoding matrix M8;

S83) acquiring a column in which only 1 lost data exists in the decoding matrix M8; selecting any column y of columns in which only 1 lost data exists; and acquiring a position $P_1$ of the lost data in the yth column, wherein the position $P_1$ of the lost data includes a row number $m_1$ and a column number $n_1$;

S84) executing longitudinal exclusive OR operations on the unlost data in the yth column one by one; and filling the longitudinal exclusive OR operation values of the unlost data in the yth column into the position $P_1$ of the lost data in the yth column;

S85) acquiring a position $P_2$ of the lost data on the $m_1$th row; executing transverse exclusive OR operations on the unlost data on the $m_1$th row one by one; and filling transverse exclusive OR operation values of the unlost data on the $m_1$th row into the position $P_2$ of the lost data in the $m_1$th row, wherein the position $P_2$ of the lost data includes a row number $m_1$ and a column number $n_2$; and S86) repeating the step S83); and restoring all the lost data in the decoding matrix M8 in sequence.

When two storage nodes are damaged, it is judged whether the storage node at which the last column of data in the storage matrix M4 is stored is damaged; if damage positions of the storage nodes are the positions 2 of the damaged nodes, that is, any two storage nodes in the first k+1 storage nodes are damaged, it shows that, two lost data exist in the first k rows of the decoding matrix M8. The first k data of data on the (k+1)th row, that is, the last row, of the decoding matrix M8 are not lost. The transverse exclusive OR operations are executed on the first k data on the (k+1)th row of the decoding matrix M8 by calculation; and the total verification value C is acquired and then filled onto the position corresponding to the decoding matrix M8. At this point, only one lost data exists in two columns of the decoding matrix M8; two lost data exist in other columns; and the column with only one lost data is considered. In the step S83), the column in which there is only 1 lost data in the decoding matrix M8 is acquired. Assuming that sequence numbers of the two damaged storage nodes are respectively a and b, sequence numbers of the only 1 lost data acquired in the decoding matrix M8 are respectively $y_a$ and $y_b$; $y_a=((a-1))<=0)*(k+1)+(a-1)$; $y_b=((b-1))<=0)*(k+1)+(b-1)$; <= represents comparison between a value in front of the symbol <= and a value behind the symbol <=; if the two values are different, the value behind the symbol <= is taken as the calculation result; and if the two values are identical, the value is 1. For example, when $y_a$ is calculated, <= represents comparison between (a−1) and 0; if (a−1) #0, the value of $((a-1))<=0)$ is 0; if (a−1)=0, the value of $((a-1))<=0)$ is 1. Any column in the matrix is taken and subjected to the longitudinal exclusive OR operation; the longitudinal exclusive OR operation value is filled into the position at which the lost data in the column is located; then the row of the lost data is found; transverse exclusive OR operations are executed on the unlost data of the row of the lost data one by one; and transverse exclusive OR operation values are filled into the position at which another lost data corresponding to the row of the lost data is located; the step S83) is repeated; and all the lost data in the decoding matrix M8 are restored in sequence.

The present invention has beneficial effects: all verification data are acquired by the exclusive OR operation only; when any two of the storage nodes are damaged, the data can be restored from data in undamaged nodes; the operation is rapid; and calculation efficiency is high.

DETAILED DESCRIPTION OF THE PRESENT INVENTION

To make purposes, technical solutions and advantages of the present invention clearer, the present invention will be further described in detail below in combination with drawings. It should be understood that, specific embodiments described herein are merely used for explaining the present invention, rather than limiting the present invention.

Embodiment 1 Assuming the quantity k of original data is equal to 6, then m is equal to 2, n is equal to k+m, and n is equal to 8. Totally 8 computers are connected through a network to form a cluster of 8 nodes; and the nodes are respectively named as $Node_1$, $Node_2$, $Node_3$, $Node_4$, $Node_5$, $Node_6$, $Node_7$ and $Node_8$.

Figure 1:
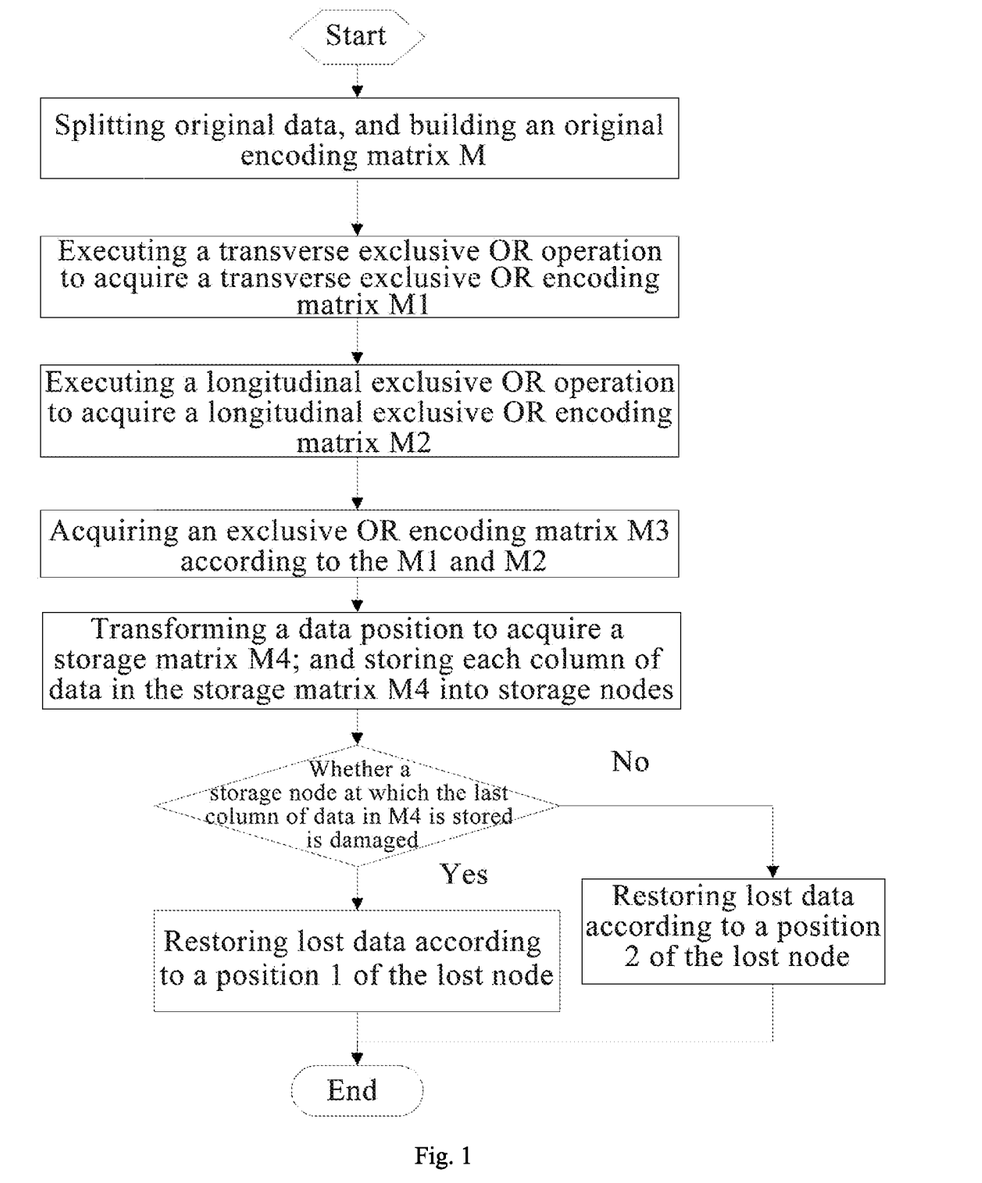
FIG. 1 is a flow chart of an erasure code calculation method in Embodiment 1 of the present invention.

As shown in FIG. 1, an erasure code calculation method includes the following steps:

S1) Original data to be stored was acquired; the original data was split; and an original encoding matrix M was built, wherein the S1) includes steps:

S11) the original data was split into n data blocks, wherein each data block included 36 data;

S12) splitting periods were set; and the 36 data in each data block were split according to the splitting period, wherein each splitting period included 6 data; and S13) the data in each splitting period were sequentially arranged in rows; and an original encoding matrix $$M = \begin{bmatrix} D_{11} & D_{12} & D_{13} & D_{14} & D_{15} & D_{16} \\ D_{21} & D_{22} & D_{23} & D_{24} & D_{25} & D_{26} \\ D_{31} & D_{32} & D_{33} & D_{34} & D_{35} & D_{36} \\ D_{41} & D_{42} & D_{43} & D_{44} & D_{45} & D_{46} \\ D_{51} & D_{52} & D_{53} & D_{54} & D_{55} & D_{56} \\ D_{61} & D_{62} & D_{63} & D_{64} & D_{kk} & D_{66} \end{bmatrix}$$

of 6 rows and 6 columns was formed, wherein $D_{56}$ represented the 6th data of the 5th splitting period.

S2) A transverse exclusive OR operation was executed on the original encoding matrix M; and a transverse exclusive OR encoding matrix M1 was acquired, wherein the S2) includes steps:

S21) the exclusive OR operation was executed on each row of data in the original encoding matrix M; and a transverse verification value set $Cr=\{Cr_1, Cr_2, Cr_3, Cr_4, Cr_5, Cr_6\}$ was acquired, wherein $Cr_4$ represented the 4th row of transverse verification values of the original encoding matrix M; $Cr_4 = D_{41}xorD_{42}xorD_{43}xorD_{44}xorD_{45}xorD_{46}$; and xor was an exclusive OR symbol;

S22) each transverse verification value in the transverse verification value set Cr was added into columns of the original encoding matrix M; and a transverse exclusive OR encoding matrix $$M1 = \begin{bmatrix} D_{11} & D_{12} & D_{13} & D_{14} & D_{15} & D_{16} & Cr_1 \\ D_{21} & D_{22} & D_{23} & D_{24} & D_{25} & D_{26} & Cr_2 \\ D_{31} & D_{32} & D_{33} & D_{34} & D_{35} & D_{36} & Cr_3 \\ D_{41} & D_{42} & D_{43} & D_{44} & D_{45} & D_{46} & Cr_4 \\ D_{51} & D_{52} & D_{53} & D_{54} & D_{55} & D_{56} & Cr_5 \\ D_{61} & D_{62} & D_{63} & D_{64} & D_{kk} & D_{66} & Cr_6 \end{bmatrix}$$

of 6 rows and 7 columns was acquired.

S3) A longitudinal exclusive OR operation was executed on the original encoding matrix M; and a longitudinal exclusive OR encoding matrix M2 was acquired, wherein the S3) includes steps:

S31) exclusive OR operations were executed on each column of data in the original encoding matrix M; and a longitudinal verification value set $Cc=\{Cc_1, Cc_2, Cc_3, Cc_4, Cc_5, Cc_6\}$ was acquired, wherein $Cc_4$ represented the 4th column of longitudinal verification values of the original encoding matrix M; $Cc_4 = D_{14} xorD_{24}xorD_{34} xorD_{44} xorD_{54} xorD_{64}$.

S32) each longitudinal verification value in the longitudinal verification value set Cc was added into rows of the original encoding matrix M; and a longitudinal exclusive OR encoding matrix $$M2 = \begin{bmatrix} D_{11} & D_{12} & D_{13} & D_{14} & D_{15} & D_{16} \\ D_{21} & D_{22} & D_{23} & D_{24} & D_{25} & D_{26} \\ D_{31} & D_{32} & D_{33} & D_{34} & D_{35} & D_{36} \\ D_{41} & D_{42} & D_{43} & D_{44} & D_{45} & D_{46} \\ D_{51} & D_{52} & D_{53} & D_{54} & D_{55} & D_{56} \\ D_{61} & D_{62} & D_{63} & D_{64} & D_{65} & D_{66} \\ Cc_1 & Cc_2 & Cc_3 & Cc_4 & Cc_5 & Cc_6 \end{bmatrix}$$

of 7 rows and 6 columns was acquired.

S4) An exclusive OR encoding matrix M3 was acquired according to the transverse exclusive OR encoding matrix M1 and the longitudinal exclusive OR encoding matrix M2, including steps:

S41) exclusive OR operations were executed on all the longitudinal verification values in the longitudinal verification value set Cc so as to obtain a total verification value $C=Cc_1xorCc_2xorCc_3xorCc_4xorCc_5xorCc_6$; or exclusive OR operations were executed on all the transverse verification values in the transverse verification value set Cr so as to obtain a total verification value $C=Cr_1xorCr_2xorCr_3 \ldots Cr_{k-1}xorCr_k$;

S42) an exclusive OR encoding matrix $$M3 = \begin{bmatrix} D_{11} & D_{12} & D_{13} & D_{14} & D_{15} & D_{16} & Cr_1 \\ D_{21} & D_{22} & D_{23} & D_{24} & D_{25} & D_{26} & Cr_2 \\ D_{31} & D_{32} & D_{33} & D_{34} & D_{35} & D_{36} & Cr_3 \\ D_{41} & D_{42} & D_{43} & D_{44} & D_{45} & D_{46} & Cr_4 \\ D_{51} & D_{52} & D_{53} & D_{54} & D_{55} & D_{56} & Cr_5 \\ D_{61} & D_{62} & D_{63} & D_{64} & D_{65} & D_{66} & Cr_6 \\ Cc_1 & Cc_2 & Cc_3 & Cc_4 & Cc_5 & Cc_6 & C \end{bmatrix}$$

of 7 rows and 7 columns was acquired.

S5) A data position of the transverse exclusive OR encoding matrix M1 was transformed to acquire a storage matrix M4; and each column of data was stored in the storage matrix M4 into storage nodes, including steps:

S51) bits of ring shift left for each row of data in the transverse exclusive OR encoding matrix M1 were set, wherein the bit of ring shift left of the xth row was (x−1)*z and z was bit width of single data; and the bits of ring shift left for each row of data in the transverse exclusive OR encoding matrix M1 were acquired;

S52) ring shift left was performed according to the bits of ring shift left for each row of data in the transverse exclusive OR encoding matrix M1; and a dislocation arrangement matrix $$M5 = \begin{bmatrix} D_{11} & D_{12} & D_{13} & D_{14} & D_{15} & D_{16} & Cr_1 \\ D_{22} & D_{23} & D_{24} & D_{25} & D_{26} & Cr_2 & D_{21} \\ D_{33} & D_{34} & D_{35} & D_{36} & Cr_3 & D_{31} & D_{32} \\ D_{44} & D_{45} & D_{46} & Cr_4 & D_{41} & D_{42} & D_{43} \\ D_{55} & D_{56} & Cr_5 & D_{51} & D_{52} & D_{53} & D_{54} \\ D_{66} & Cr_6 & D_{61} & D_{62} & D_{63} & D_{64} & D_{65} \end{bmatrix}$$

of 6 rows and 7 columns was acquired; and

S53) each longitudinal verification value in the longitudinal verification value set Cc was added into columns of the dislocation arrangement matrix M5; and a storage matrix $$M4 = \begin{bmatrix} D_{11} & D_{12} & D_{13} & D_{14} & D_{15} & D_{16} & Cr_1 & Cc_1 \\ D_{22} & D_{23} & D_{24} & D_{25} & D_{26} & Cr_2 & D_{21} & Cc_2 \\ D_{33} & D_{34} & D_{35} & D_{36} & Cr_3 & D_{31} & D_{32} & Cc_3 \\ D_{44} & D_{45} & D_{46} & Cr_4 & D_{41} & D_{42} & D_{43} & Cc_4 \\ D_{55} & D_{56} & Cr_5 & D_{51} & D_{52} & D_{53} & D_{54} & Cc_5 \\ D_{66} & Cr_6 & D_{61} & D_{62} & D_{63} & D_{64} & D_{65} & Cc_6 \end{bmatrix}$$

of 6 rows and 8 columns was acquired;

S54) the storage matrix M4 was grouped in columns, wherein each column was a group; totally 8 data groups were formed and recorded as $\{G_1, G_2, G_3, G_4, G_5, G_6, G_7, G_8\}$; $G_8$ represented the 8th data group; and $$G_8 = \begin{bmatrix} Cc_1 \\ Cc_2 \\ Cc_3 \\ Cc_4 \\ Cc_5 \\ Cc_6 \end{bmatrix};$$

S55) 8 storage nodes were acquired; and the 8 storage nodes were recorded {$Node_1$, $Node_2$, $Node_3$, $Node_4$, $Node_5$, $Node_6$, $Node_7$, $Node_8$}, wherein $Node_8$ represents the 8th storage node; and S56) the 8 data groups were respectively stored into storage nodes that corresponded to subscripts of the data groups; and the 8th data group was stored into the 8th storage node.

S6) Whether storage nodes at which the last column of data of the storage matrix M4 was stored were damaged was judged; if so, a step S7) was executed; otherwise, a step S8) was executed.

S7) The quantity m of the verification codes was equal to 2, i.e., two storage nodes were allowed to be damaged at most; when the damaged storage nodes included $Node_8$, assuming that the $Node_8$ and $Node_3$ were damaged, the lost data were as shown in Table 1.

Table 1 Lost Data Table when the Damaged Storage Nodes Include $Node_8$

TABLE 1

| | | | | | | | |
|---|---|---|---|---|---|---|---|
| $D_{11}$ | $D_{12}$ | $D_{13}$ | $D_{14}$ | $D_{15}$ | $D_{16}$ | $Cr_1$ | $Cc_1$ |
| $D_{22}$ | $D_{23}$ | $D_{24}$ | $D_{25}$ | $D_{26}$ | $Cr_2$ | $D_{21}$ | $Cc_2$ |
| $D_{33}$ | $D_{34}$ | $D_{35}$ | $D_{36}$ | $Cr_3$ | $D_{31}$ | $D_{32}$ | $Cc_3$ |
| $D_{44}$ | $D_{45}$ | $D_{46}$ | $Cr_4$ | $D_{41}$ | $D_{42}$ | $D_{43}$ | $Cc_4$ |
| $D_{55}$ | $D_{56}$ | $Cr_5$ | $D_{51}$ | $D_{52}$ | $D_{53}$ | $D_{54}$ | $Cc_5$ |
| $D_{66}$ | $Cr_6$ | $D_{61}$ | $D_{62}$ | $D_{63}$ | $D_{64}$ | $D_{65}$ | $Cc_6$ |

Figure 2:
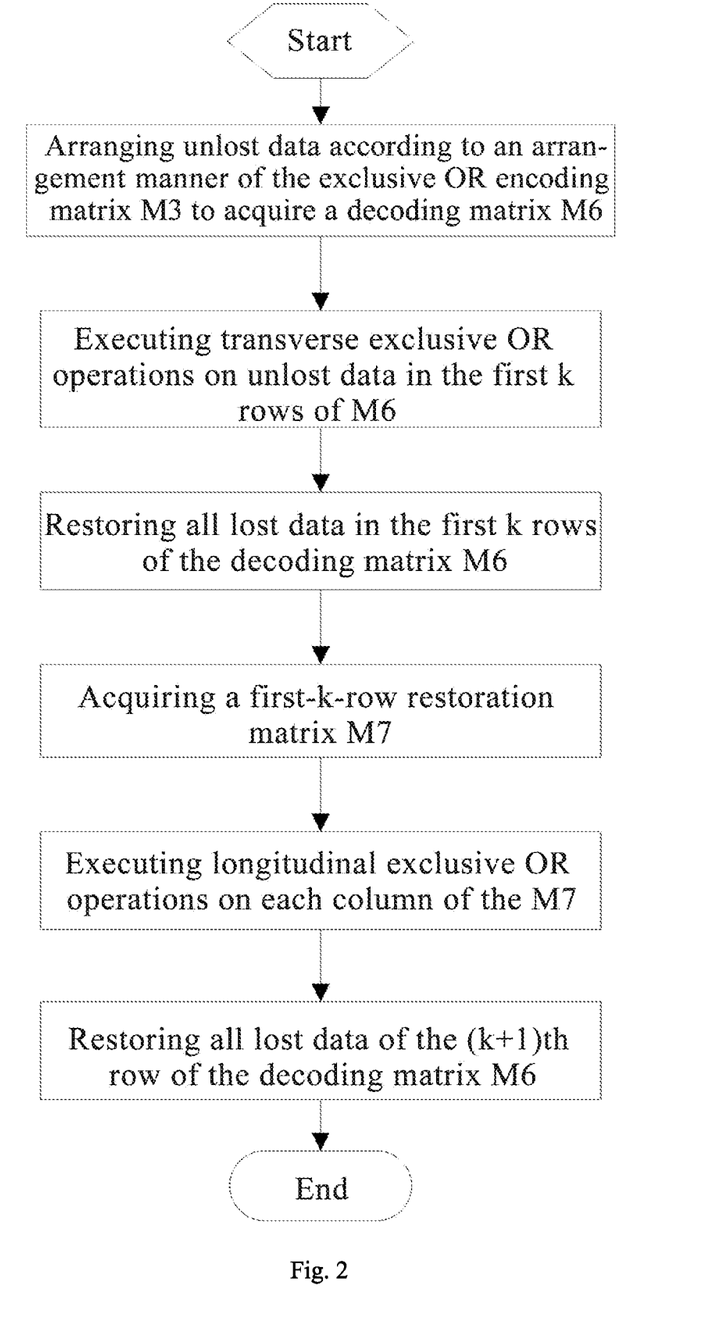
FIG. 2 is a flow chart of restoration of lost data according to a position 1 of a lost node in Embodiment 1 of the present invention.

The lost data were restored according to a position 1 of the lost nodes, that is, $Node_8$ and $Node_3$. As shown in FIG. 2, the S7) includes steps:

S71) data in all undamaged storage nodes were acquired; unlost data were arranged according to an arrangement manner of the exclusive OR encoding matrix M3; a decoding matrix M6 was acquired; and positions of each row of lost data in the decoding matrix M6 were acquired, wherein the positions of each row of lost data in the decoding matrix M6 were as shown in Table 2.

Table 2 Table for Each Row of Lost Data in the Decoding Matrix M6

TABLE 2

| | | | | | | |
|---|---|---|---|---|---|---|
| $D_{11}$ | $D_{12}$ | $D_{13}$ | $D_{14}$ | $D_{15}$ | $D_{16}$ | $Cr_1$ |
| $D_{21}$ | $D_{22}$ | $D_{23}$ | $D_{24}$ | $D_{25}$ | $D_{26}$ | $Cr_2$ |
| $D_{31}$ | $D_{32}$ | $D_{33}$ | $D_{34}$ | $D_{35}$ | $D_{36}$ | $Cr_3$ |
| $D_{41}$ | $D_{42}$ | $D_{43}$ | $D_{44}$ | $D_{45}$ | $D_{46}$ | $Cr_4$ |
| $D_{51}$ | $D_{52}$ | $D_{53}$ | $D_{54}$ | $D_{55}$ | $D_{56}$ | $Cr_5$ |
| $D_{61}$ | $D_{62}$ | $D_{63}$ | $D_{64}$ | $D_{65}$ | $D_{66}$ | $Cr_6$ |
| $Cc_1$ | $Cc_2$ | $Cc_3$ | $Cc_4$ | $Cc_5$ | $Cc_6$ | C |

S72) Transverse exclusive OR operations were executed on unlost data on the ith row of the decoding matrix M6 one by one in rows; respective transverse exclusive OR operation values $C_i$ of the unlost data on the ith row in rows were acquired; the values $C_i$ were filled into the positions of the lost data on the ith row, wherein i∈{1, 2, ..., 6}; all the lost data on the first 6 rows of the decoding matrix M6 were sequentially restored; and a first-6-row restoration matrix M7 was acquired;

S73) longitudinal exclusive OR operations were executed on the jth column of the first-6-row restoration matrix M7; longitudinal exclusive OR operation values of the jth column were filled into the 7th row and the jth column of the decoding matrix M6, wherein j∈{1, 2, ..., 7}; and all the lost data on the 7th row of the decoding matrix M6 were restored.

It can be seen from Table 2 that, in the first 6 rows of the decoding matrix M6, there was only 1 data lost in each row, and data in the 7th row were totally lost. The exclusive OR operations were executed on unlost data in each row of the first 6 rows of the decoding matrix M6, and then the lost data in each row can be restored. The lost data in each row were respectively $D_{13}$, $D_{24}$, $D_{35}$, $D_{46}$, $Cr_5$ and $D_{61}$; and these restored data are filled into corresponding positions of the decoding matrix M6. After the lost data in the first 6 rows of the decoding matrix M6 were filled, there was only 1 data lost in each column of the decoding matrix M6. Then, the exclusive OR operations were executed on the unlost data in each row, and the data in each row can be restored one by one. The lost data in each row were respectively $Cc_1$, $Cc_2$, $Cc_3$, $Cc_4$, $Cc_5$, $Cc_6$ and C; the restored data were filled into the corresponding positions; and finally the lost data were totally completely restored.

S8) When the damaged storage nodes did not include the $Node_8$, assuming that positions 2 of the damaged nodes were $Node_3$ and $Node_5$, then the lost data were as shown in Table 3.

Table 3 Lost Data Table when the Damaged Storage Nodes do not Include $Node_8$

TABLE 3

| | | | | | | | |
|---|---|---|---|---|---|---|---|
| $D_{11}$ | $D_{12}$ | $D_{13}$ | $D_{14}$ | $D_{15}$ | $D_{16}$ | $Cr_1$ | $Cc_1$ |
| $D_{22}$ | $D_{23}$ | $D_{24}$ | $D_{25}$ | $D_{26}$ | $Cr_2$ | $D_{21}$ | $Cc_2$ |
| $D_{33}$ | $D_{34}$ | $D_{35}$ | $D_{36}$ | $Cr_3$ | $D_{31}$ | $D_{32}$ | $Cc_3$ |
| $D_{44}$ | $D_{45}$ | $D_{46}$ | $Cr_4$ | $D_{41}$ | $D_{42}$ | $D_{43}$ | $Cc_4$ |
| $D_{55}$ | $D_{56}$ | $Cr_5$ | $D_{51}$ | $D_{52}$ | $D_{53}$ | $D_{54}$ | $Cc_5$ |
| $D_{66}$ | $Cr_6$ | $D_{61}$ | $D_{62}$ | $D_{63}$ | $D_{64}$ | $D_{65}$ | $Cc_6$ |

Figure 3:
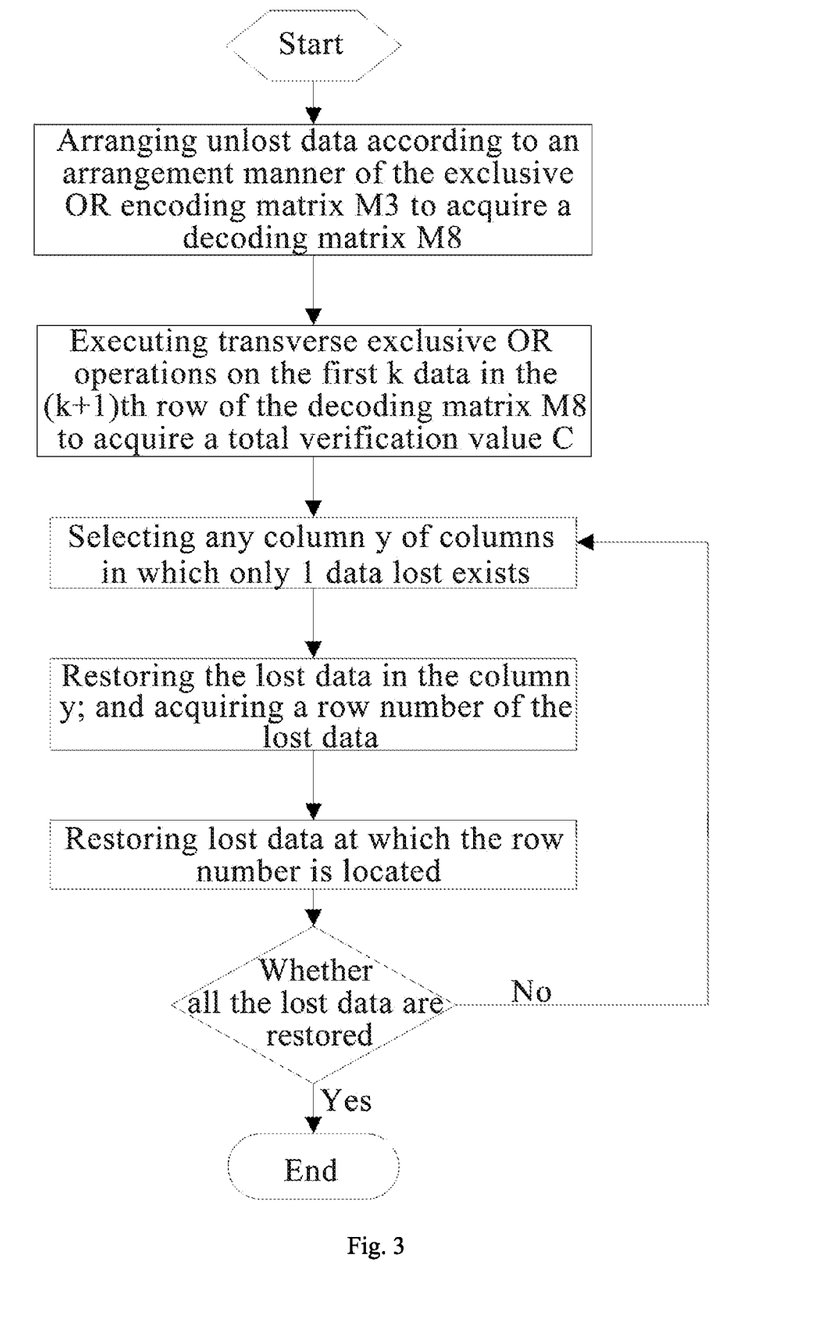
FIG. 3 is a flow chart of restoration of lost data according to a position 2 of a lost node in Embodiment 1 of the present invention.

The lost data were restored according to the position 2 of the lost nodes, i.e., $Node_3$ and $Node_5$. As shown in FIG. 3, the S8) includes steps:

S81) data in all undamaged storage nodes were acquired; unlost data were arranged according to an arrangement manner of the exclusive OR encoding matrix M3; a decoding matrix M8 was acquired; and positions of lost data in the decoding matrix M8 were acquired, wherein the positions of the lost data in each row of the decoding matrix M8 were as shown in Table 4.

Table 4 Lost Data Table in Each Row of the Decoding Matrix M8

TABLE 4

| | | | | | | |
|---|---|---|---|---|---|---|
| $D_{11}$ | $D_{12}$ | $D_{13}$ | $D_{14}$ | $D_{15}$ | $D_{16}$ | $Cr_1$ |
| $D_{21}$ | $D_{22}$ | $D_{23}$ | $D_{24}$ | $D_{25}$ | $D_{26}$ | $Cr_2$ |
| $D_{31}$ | $D_{32}$ | $D_{33}$ | $D_{34}$ | $D_{35}$ | $D_{36}$ | $Cr_3$ |
| $D_{41}$ | $D_{42}$ | $D_{43}$ | $D_{44}$ | $D_{45}$ | $D_{46}$ | $Cr_4$ |

TABLE 4-continued

| $D_{51}$ | $D_{52}$ | $D_{53}$ | $D_{54}$ | $D_{55}$ | $D_{56}$ | $Cr_5$ |
|---|---|---|---|---|---|---|
| $D_{61}$ | $D_{62}$ | $D_{63}$ | $D_{64}$ | $D_{65}$ | $D_{66}$ | $Cr_6$ |
| $Cc_1$ | $Cc_2$ | $Cc_3$ | $Cc_4$ | $Cc_5$ | $Cc_6$ | C |

S82) Transverse exclusive OR operations were executed on the first 6 data on the 7th row of the decoding matrix M8; a total verification value C was acquired; and the total verification value C was filled into the 7th row and the 7th column of the decoding matrix M8.

S83) A column in which there was only 1 lost data in the decoding matrix M8 was acquired; any column y of columns in which there was only 1 lost data was selected; and a position $P_1$ of the lost data in the yth column was acquired, wherein the position $P_1$ of the lost data included a row number $m_1$ and a column number $n_1$.

S84) Longitudinal exclusive OR operations were executed on the unlost data in the yth column one by one; and the longitudinal exclusive OR operation values of the unlost data in the yth column were filled into the position $P_1$ of the lost data in the yth column.

S85) A position $P_2$ of the lost data on the $m_1$th row was acquired; transverse exclusive OR operations were executed on the unlost data on the $m_1$th row one by one; and transverse exclusive OR operation values of the unlost data on the $m_1$th row were filled into the position $P_2$ of the lost data in the $m_1$th row one by one, wherein the position $P_2$ of the lost data includes a row number $m_1$ and a column number $n_2$.

S86) The step S83) was repeated; and all the lost data in the decoding matrix M8 were restored in sequence.

It can be seen from Table 4 that, data in the 7th row were integral; there were 2 data lost in each row of the first 6 rows; there was 1 data lost in the 2nd column and the 4th column; and there were 2 data lost in other columns. The 2nd column was selected; $D_{52}$ was restored through residual unlost data in the column; then the data $Cr_5$ was restored through the unlost data in the 5th row at which the $D_{52}$ was located; by parity of reasoning, a row or column at which only 1 lost data existed was found; a sequence of the restored data may be $D_{52}$, $Cr_5$, $Cr_3$, $D_{35}$, $D_{15}$, $D_{13}$, $D_{63}$, $D_{61}$, $D_{41}$, $D_{46}$, $D_{26}$ and $D_{24}$; and finally the lost data were totally completely restored.

Through the above technical solutions of the present invention, beneficial effects of the present invention are as follows:

In the present invention, all the verification data are acquired by the exclusive OR operation only; when any two of the storage nodes are damaged, the data can be restored from the data in undamaged nodes; the operation is rapid; and the calculation efficiency is high.

The above are merely preferred embodiments of the present invention. It shall be indicated that, several improvements and modifications may be made by those ordinary skilled in the art without departing from the principles of the present invention. These improvements and modifications shall be regarded as the protection scope of the present invention.

What is claimed is:

1. An erasure code calculation method applied in a distributed storage network comprising a plurality of storage devices, the method comprising the following steps:
   S1) acquiring original data to be stored in the storage devices of the distributed storage network; splitting the original data; and building an original encoding matrix M;
   S2) executing a transverse exclusive OR operation on the original encoding matrix M to acquire a transverse exclusive OR encoding matrix M1;
   S3) executing a longitudinal exclusive OR operation on the original encoding matrix M to acquire a longitudinal exclusive OR encoding matrix M2;
   S4) acquiring an exclusive OR encoding matrix M3 according to one of the transverse exclusive OR encoding matrix M1 and the longitudinal exclusive OR encoding matrix M2;
   S5) transforming a data position of the transverse exclusive OR encoding matrix M1 to acquire a storage matrix M4; and storing each column of data in the storage matrix M4 into one of the storage devices of the distributed storage network, and numbering the storage devices with the data stored;
   S5.1) determining that at least one of the storage devices with the data stored is damaged;
   S6) determining whether the damaged storage device is stored with the last column of data of the storage matrix M4; if so, entering a step S7); otherwise, entering a step S8);
   S7) restoring data for the damaged storage device with the data stored in remaining storage devices of the distributed storage network via a first scheme; and
   S8) restoring data for the damaged storage device with the data stored in remaining storage devices of the distributed storage network via a second scheme different from the first scheme;
   wherein the step S1) of splitting the original data and building the original encoding matrix M comprises steps:
   S11) splitting the original data into n data blocks, wherein each data block comprises $k^2$ data;
   S12) setting splitting periods; and splitting the $k^2$ data in each data block according to the splitting period, wherein each splitting period comprises k data; and
   S13) sequentially arranging the data in each splitting period in rows; and forming an original encoding matrix M =

$$M = \begin{bmatrix} D_{11} & D_{12} & \cdots & D_{1k-1} & D_{1k} \\ D_{21} & D_{22} & \cdots & D_{2k-1} & D_{2k} \\ \vdots & \vdots & \ddots & \vdots & \vdots \\ D_{x1} & D_{x2} & \cdots & D_{xk-1} & D_{xk} \\ \vdots & \vdots & \ddots & \vdots & \vdots \\ D_{k1} & D_{k2} & \cdots & D_{kk-1} & D_{kk} \end{bmatrix}$$

of k rows and k columns, wherein $D_{xk-1}$ represents the (k−1)th data of the xth splitting period;
   the step S2) of executing the transverse exclusive OR operation on the original encoding matrix M to acquire the transverse exclusive OR encoding matrix M1 comprises steps:
   S21) executing the exclusive OR operation on each row of data in the original encoding matrix M to acquire a transverse verification value set Cr={$Cr_1$, $Cr_2$, . . . , $Cr_x$, . . . , $Cr_{k-1}$, $Cr_5$}, wherein $Cr_x$ represents the xth row of transverse verification values of the original encoding matrix M;
   $Cr_x = D_{x1} \text{xor} D_{x2} \text{xor} D_{x3} \ldots D_{xk-1} \text{xor} D_{xk}$; and xor and is an exclusive OR symbol;
   S22) adding each transverse verification value in the transverse verification value set Cr into columns of the original encoding matrix M to acquire a transverse exclusive OR encoding matrix M1=

$$M1 = \begin{bmatrix} D_{11} & D_{12} & \cdots & D_{1k-1} & D_{1k} & Cr_1 \\ D_{21} & D_{22} & \cdots & D_{2k-1} & D_{2k} & Cr_2 \\ \vdots & \vdots & \ddots & \vdots & \vdots & \vdots \\ D_{x1} & D_{x2} & \cdots & D_{xk-1} & D_{xk} & Cr_x \\ \vdots & \vdots & \ddots & \vdots & \vdots & \vdots \\ D_{k1} & D_{k2} & \cdots & D_{kk-1} & D_{kk} & Cr_k \end{bmatrix}$$

of k rows and k+1 columns;

the step S3) of executing the longitudinal exclusive OR operation on the original encoding matrix M to acquire the longitudinal exclusive OR encoding matrix M2 comprises steps:

S31) executing exclusive OR operations on each column of data in the original encoding matrix M to acquire a longitudinal verification value set $Cr=\{Cr_1, Cr_2, \ldots, Cr_x, \ldots, Cr_{k-1}, Cr_5\}$, wherein $Cc_x$ represents the xth column of longitudinal verification values of the original encoding matrix M; $Cc_x = D_{1x} \text{xor} D_{2x} \text{xor} D_{3x} \ldots D_{l-x1} \text{xor } D_{kx}$;

S32) adding each longitudinal verification value in the longitudinal verification value set Cc into rows of the original encoding matrix M to acquire a longitudinal exclusive OR encoding matrix M2=

$$M2 = \begin{bmatrix} D_{11} & D_{12} & \cdots & D_{1k-1} & D_{1k} \\ D_{21} & D_{22} & \cdots & D_{2k-1} & D_{2k} \\ \vdots & \vdots & \ddots & \vdots & \vdots \\ D_{x1} & D_{x2} & \cdots & D_{xk-1} & D_{xk} \\ \vdots & \vdots & \ddots & \vdots & \vdots \\ D_{k1} & D_{k2} & \cdots & D_{kk-1} & D_{kk} \\ Cc_1 & Cc_2 & \cdots & Cc_{k-1} & Cc_k \end{bmatrix}$$

of k+1 rows and k columns;

the step S4) of acquiring the exclusive OR encoding matrix M3 according to the transverse exclusive OR encoding matrix M1 and the longitudinal exclusive OR encoding matrix M2 comprises steps:

S41) executing exclusive OR operations on all the longitudinal verification values in the longitudinal verification value set Cc to obtain a total verification value $C=Cc_1 \text{xor } Cc_2 \text{xor } Cc_3 \ldots Cc_{k-1} \text{xor } Cc_k$; or executing exclusive OR operations on all the transverse verification values in the transverse verification value set Cr to obtain a total verification value $C=Cc_1 \text{xor } Cc_2 \text{xor } Cc_3 \ldots Cc_{k-1} \text{xor } Cc_k$; and S42) acquiring an exclusive OR encoding matrix M3=

$$M3 = \begin{bmatrix} D_{11} & D_{12} & \cdots & D_{1k-1} & D_{1k} & Cr_1 \\ D_{21} & D_{22} & \cdots & D_{2k-1} & D_{2k} & Cr_2 \\ \vdots & \vdots & \ddots & \vdots & \vdots & \vdots \\ D_{x1} & D_{x2} & \cdots & D_{xk-1} & D_{xk} & Cr_x \\ \vdots & \vdots & \ddots & \vdots & \vdots & \vdots \\ D_{k1} & D_{k2} & \cdots & D_{kk-1} & D_{kk} & Cr_k \\ Cc_1 & Cc_2 & \cdots & Cc_{k-1} & Cc_k & C \end{bmatrix}$$

of k+1 rows and k+1 columns the step S5) of transforming the data position of the transverse exclusive OR encoding matrix M1 to acquire the storage matrix M4 comprises steps:

S51) setting a quantity of bits for ring shift left for each row of data in the transverse exclusive OR encoding matrix M1, wherein for the xth row of data in the transverse exclusive OR encoding matrix M1, the quantity of bits for the ring shift left is (x−1)* z and z is bit width of single data; and acquiring the quantity of bits for the ring shift left for each row of data in the transverse exclusive OR encoding matrix M1, S52) performing the ring shift left according to the quantity of bits for the ring shift left for each row of data in the transverse exclusive OR encoding matrix M1 to acquire a dislocation arrangement matrix M5=

$$M5 = \begin{bmatrix} D_{11} & D_{12} & \cdots & D_{1k-1} & D_{1k} & Cr_1 \\ D_{22} & D_{23} & \cdots & D_{2k} & Cr_2 & D_{21} \\ \vdots & \vdots & \ddots & \vdots & \vdots & \vdots \\ D_{xx} & D_{xx+1} & \cdots & D_{xk-3} & D_{xk-2} & D_{xx-1} \\ \vdots & \vdots & \ddots & \vdots & \vdots & \vdots \\ D_{kk} & Cr_k & \cdots & D_{kk-3} & D_{kk-2} & D_{kk-1} \end{bmatrix}$$

of k rows and k+1 columns; and

S53) adding each element in the longitudinal verification value set Cc into columns of the dislocation arrangement matrix M5 to acquire a storage matrix M4=

$$M4 = \begin{bmatrix} D_{11} & D_{12} & \cdots & D_{1k-1} & D_{1k} & Cr_1 & Cc_1 \\ D_{22} & D_{23} & \cdots & D_{2k} & Cr_2 & D_{21} & Cc_2 \\ \vdots & \vdots & \ddots & \vdots & \vdots & \vdots & \vdots \\ D_{xx} & D_{xx+1} & \cdots & D_{xk-3} & D_{xk-2} & D_{xx-1} & Cc_x \\ \vdots & \vdots & \ddots & \vdots & \vdots & \vdots & \vdots \\ D_{kk} & Cr_k & \cdots & D_{kk-3} & D_{kk-2} & D_{kk-1} & Cc_k \end{bmatrix}$$

of k rows and k+2 columns.

2. The erasure code calculation method according to claim 1, wherein the step S5) of storing each column of data in the storage matrix M4 into one of the storage devices of the distributed storage network comprises steps:

S54) grouping the storage matrix M4 in columns, wherein each column is a group; totally k+2 data groups are formed and recorded as $\{G_1, G_2, \ldots, G_{k+1}, G_{k+2}\}$; $G_{k+1}$ represents the (k+1)th data group; and $$G_{k+1} = \begin{bmatrix} Cr_1 \\ D_{21} \\ \vdots \\ D_{xx-1} \\ \vdots \\ D_{kk-1} \end{bmatrix};$$

S55) acquiring k+2 storage devices; and recording the k+2 storage devices as $\{Node_1, Node_2, \ldots, Node_k+, Node_{k+2}\}$, wherein $Node_{k+1}$ represents the (k+1)th storage devices; and S56) respectively storing the k+2 data groups into storage devices that correspond to subscripts of the data groups; and storing the (k+1)th data group into the (k+1)th storage device.

3. The erasure code calculation method according to claim 2, wherein in the step S7), when any one storage device in the first k+1 storage devices and the (k+2)th storage device are damaged;

the step of restoring data for the damaged storage device with the data stored in remaining storage devices of the distributed storage network via a first scheme comprises steps:

S71) acquiring data in all undamaged storage devices; arranging unlost data according to an arrangement manner of the exclusive OR encoding matrix M3; acquiring a decoding matrix M6; and acquiring positions of each row of lost data in the decoding matrix M6;

S72) executing transverse exclusive OR operations on unlost data on the ith row of the decoding matrix M6 one by one in rows; acquiring respective transverse exclusive OR operation values $C_i$ of the unlost data on the ith row in rows; filling the values $C_i$ into the positions of the lost data on the ith row, wherein i $\in\{1,2, \ldots, k\}$; sequentially restoring all the lost data on the first k rows of the decoding matrix M6; and acquiring a first-k-row restoration matrix M7;

S73) executing longitudinal exclusive OR operations on the jth column of the first-k-row restoration matrix M7; filling longitudinal exclusive OR operation values of the jth column into the (k+1)th row and the jth column of the decoding matrix M6, wherein j $\in\{1,2, \ldots, k, k+1\}$; and restoring all the lost data on the (k+1)th row of the decoding matrix M6.

4. The erasure code calculation method according to claim 3, wherein in the step S8), when any two storage devices in the first k+1 storage devices are damaged;

the step of restoring data for the damaged storage device with the data stored in remaining storage devices of the distributed storage network via a second scheme comprises steps:

S81) acquiring data in all undamaged storage devices; arranging unlost data according to an arrangement manner of the exclusive OR encoding matrix M3;

acquiring a decoding matrix M8; and acquiring positions of lost data in the decoding matrix M8;

S82) executing transverse exclusive OR operations on the first k data on the (k+1)th row of the decoding matrix M8; acquiring a total verification value C; and filling the total verification value C into the (k+1)th row and the (k+1)th column of the decoding matrix M8;

S83) acquiring a column in which only 1 lost data exists in the decoding matrix M8; selecting any column y of columns in which only 1 lost data exists; and acquiring a position $P_1$ of the lost data in the yth column, wherein the position $P_1$ of the lost data comprises a row number $m_1$ and a column number $n_1$;

S84) executing longitudinal exclusive OR operations on the unlost data in the yth column one by one; and filling the longitudinal exclusive OR operation values of the unlost data in the yth column into the position $P_1$ of the lost data in the yth column;

S85) acquiring a position $P_2$ of the lost data on the mith row; executing transverse exclusive OR operations on the unlost data on the mith row one by one; and filling transverse exclusive OR operation values of the unlost data on the mith row into the position $P_2$ of the lost data in the mith row, wherein the position $P_2$ of the lost data comprises a row number $m_1$ and a column number $n_2$; and S86) repeating the step S83); and restoring all the lost data in the decoding matrix M8 in sequence.

* * * * *